Figure 1:
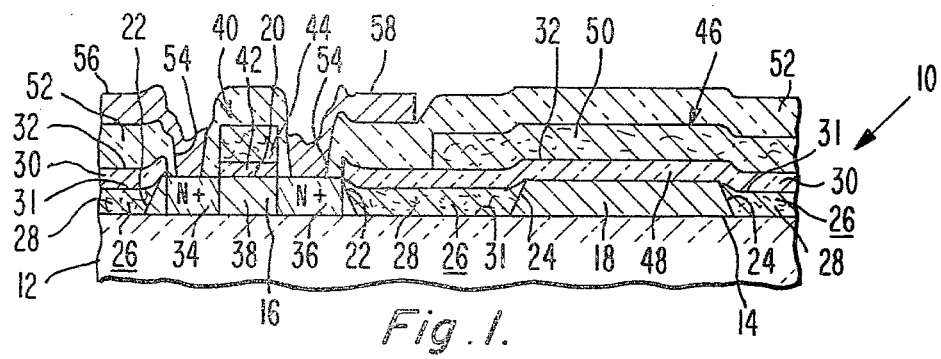

United States Patent [19]

Ham

[11] 4,262,299
[45] Apr. 14, 1981

[54] SEMICONDUCTOR-ON-INSULATOR DEVICE AND METHOD FOR ITS MANUFACTURE

[75] Inventor: William E. Ham, Mercerville, N.J.

[73] Assignee: RCA Corporation, New York, N.Y.

[21] Appl. No.: 7,578

[22] Filed: Jan. 29, 1979

[51] Int. Cl.³ .................... H01L 27/12; H01L 29/04
[52] U.S. Cl. ............................. 357/49; 357/4; 357/41; 357/52; 357/59
[58] Field of Search ............... 357/4, 59, 49, 52, 41, 357/42

[56] References Cited

U.S. PATENT DOCUMENTS

| | | | |
|---|---|---|---|
| 3,496,037 | 2/1970 | Jackson | 357/59 |
| 3,617,822 | 11/1971 | Kobayashi | 357/59 |
| 3,666,548 | 5/1972 | Brack | 357/59 |
| 3,740,280 | 6/1973 | Ronen | 357/4 |
| 3,791,882 | 2/1974 | Ogiue | 357/59 |
| 4,009,484 | 2/1977 | Ogiue et al. | 357/59 |
| 4,012,762 | 3/1977 | Abe et al. | 357/59 |
| 4,017,769 | 4/1977 | Raetzel et al. | 357/59 |
| 4,086,613 | 4/1978 | Biet | 357/59 |

OTHER PUBLICATIONS

Electronics, May 26, 1977, pp. 99-105.

*Primary Examiner*—William D. Larkins
*Attorney, Agent, or Firm*—Birgit E. Morris; D. S. Cohen; Lawrence P. Benjamin

[57] ABSTRACT

A monolithic semiconductor-on-insulator device includes silicon islands in spaced relation on the surface of an insulating substrate, with the spaces between the islands occupied by a passivating material which comprises a layer of a semi-insulating material having finite but low conductivity on the surface of the substrate and extending between adjacent islands into contiguous relation with the side surfaces thereof. The surface of the semi-insulating material has a layer of insulating silicon dioxide thereon. The conductivity of the semi-insulating material is such that charge does not accumulate in this material adjacent to the side edges of the islands, but its conductivity is low enough so that leakage currents between devices remain below an amount which would render the circuit which uses the device non-operative.

6 Claims, 4 Drawing Figures

SEMICONDUCTOR-ON-INSULATOR DEVICE AND METHOD FOR ITS MANUFACTURE

This invention relates to monolithic silicon-on-insulating-substrate devices. These devices are typically silicon-on-sapphire MOS integrated circuit devices, and this invention pertains to the passivation and stabilization of the edges of silicon islands in such devices.

Some known silicon-on-sapphire devices have spaced islands of silicon on the surface of a sapphire substrate in which islands the active devices of a circuit are formed. The islands are typically of mesa shape, having a flat top surface parallel to the surface of the substrate and side surfaces extending at an angle to the substrate. Isolation is provided by the insulating substrate and the air in the spaces between the islands, and both the top surfaces and the side surfaces of the islands are oxidized to provide a passivating coating of silicon dioxide. Significant problems have existed in these devices which have been traced at least in part to the material adjacent to the side edges of the islands, when this material is intercepted by the boundaries of the channel region of an MOS device in the island and when conductive material, particularly gate material, extends over the oxide on the side edges. Effectively, the side edges provide transistors in parallel with the transistor defined by the top surface. The "side transistors" are unstable and render the operation of the device unpredictable.

Silicon-on-sapphire devices are also known in which passivating material occupies the spaces between the islands. These devices are called "coplanar devices" because the upper surfaces of the islands and the surface of the insulating material are arranged to be substantially coplanar. These devices have no large steps over which metallization must extend.

One well-known method for making coplanar silicon-on-sapphire devices is known as the "LOSOS" process. See *Electronics Magazine* for May 26, 1977 at page 101. This process is characterized by a step of locally etching a continuous epitaxial layer of silicon to a depth of about half its thickness in the areas intended to become the passivating layer and then oxidizing this material through to the substrate. The side edges of the silicon islands are also oxidized during this step. The resulting oxide layer is approximately twice the thickness of the silicon which was oxidized so that the surface of the oxide becomes substantially coplanar with the surfaces of the unoxidized remaining silicon. This process is quite useful in providing passivation of relatively high dielectric strength, but the resulting devices still exhibit problems of instability associated with the material of the silicon islands adjacent to their side edges and the oxidation of part of this material. The present process eliminates edge instability in the resulting product while retaining high dielectric strength.

Figure 2:
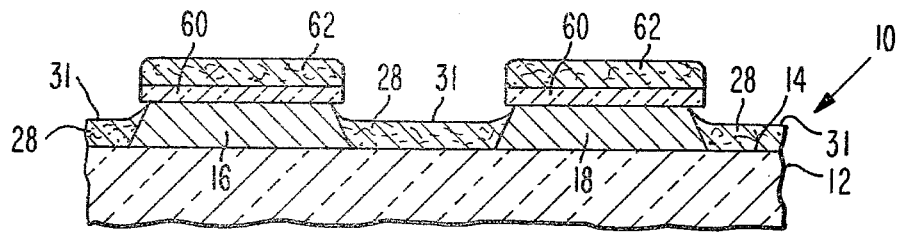
Figure 3:
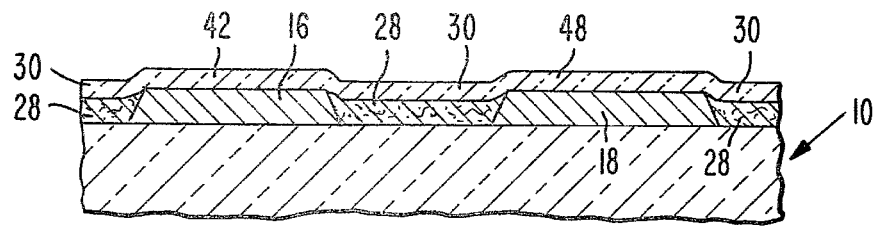
Figure 4:
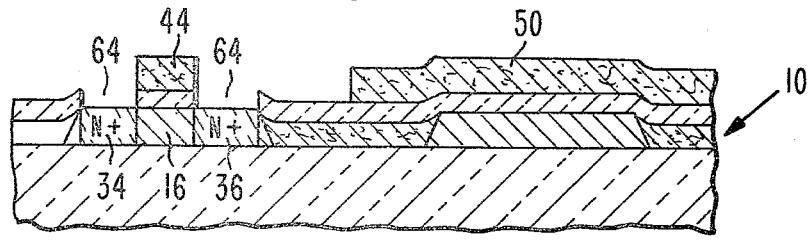

In the drawings:

FIG. 1 is a partial cross-sectional view of one embodiment of the present semiconductor-on-insulating-substrate device, and FIGS. 2, 3, and 4 are partial cross-sectional views illustrating various steps in the present process.

The present semiconductor-on-insulating-substrate device is shown partially and diagrammatically in a silicon-on-sapphire embodiment at 10 in the drawings. As illustrated in FIG. 1, the device 10 has a supporting, insulating substrate 12 of a material capable of promoting the epitaxial growth of monocrystalline silicon. The substrate 12 is usually of monocrystalline sapphire, although such materials as spinel and beryllium oxide are also suitable. The substrate 12 has a surface 14 which is oriented as known in the art so as to be capable of supporting the epitaxial growth of silicon with a desired orientation. Preferably, the surface 14 is oriented parallel, within manufacturing tolerances, to a ($1\bar{1}02$) crystallographic plane of the substrate 12, in which case the resulting silicon will have its (100) planes parallel to the surface 14.

Any given integrated circuit device 10 will have a large plurality of silicon islands in which the active elements of a circuit are disposed. There may be thousands of islands in so-called "Large Scale Integration (LSI)" circuits or even tens of thousands in "Very Large Scale Integration (VLSI)" circuits. For purposes of explanation of this invention, only two such islands are shown, at 16 and 18. The islands 16 and 18 are epitaxially related to the substrate 12 and are spaced from each other. The islands 16 and 18 are 0.05 to 1.5 micrometers ($\mu m$) thick, preferably about 0.6 $\mu m$, and have upper surfaces 20 and 22, respectively, which are coplanar owing to the fact that the islands 16 and 18 were originally part of a continuous layer of silicon, not shown as such. The islands 16 and 18 also have side surfaces 22 and 24, respectively. It is generally known in this art that the material of the islands adjacent to these side surfaces 22 and 24 has characteristics different from those of the material adjacent to the upper surfaces 20 and 22 and that this side surface material is responsible for many unstable conditions in these devices.

In the device 10, the spaces between the islands, designated generally by the numeral 26 is filled or partially filled with a passivating material which has qualities, as shall be explained, which substantially eliminate edge instability effects in the islands 16 and 18. It is not necessary to the present invention that this passivating material have an upper surface which is coplanar with the upper surfaces 20 and 22 of the islands 16 and 18. While not necessary, this feature is desirable and, in its preferred form, the passivating material comprises a layer 28, about 0.6 $\mu m$ thick, which may be described generally as being of semi-insulating amorphous or polycrystalline silicon (here called polysilicon in both forms) which is on and contiguous with the surface 14 of the substrate 12 and extends between the islands 16 and 18, and other islands not shown, in contiguous relation to the side surfaces 22, 24 thereof. There is also a layer 30 of silicon dioxide about 100 nanometers (nm) thick on the upper surface 31 of the layer of polysilicon, the silicon dioxide layer 30 having a surface 32. Preferably, the silicon dioxide layer 30 is thermally grown from the material of the polysilicon layer 28.

The details of the active elements formed in the islands 16 and 18 are not critical to the present invention except as their structure relates to the edge instability problem, i.e. that they are MOS transistors the channels of which terminate in the side surfaces 22 and 24. Structures are known in which the transistor channels are wholly within the island, and these structures do not require the present invention.

For purposes of explanation, there is shown in the device 10 the structure of an N channel MOS transistor in the island 16, where the cross-section is taken parallel to the direction of current flow in the transistor. The island 16 is shown as containing spaced regions 34 and 36 of N+ type conductivity, which are the source and drain regions of the transistor. A channel region 38 occupies the space between the regions 34 and 36 and a gate structure 40, consisting of an insulating layer 42 having the appropriate characteristics to be an MOS gate insulator and a gate conductor 44, is disposed over the channel region 38.

Another MOS transistor may occupy the island 18. In this case, the transistor is assumed to be oriented orthogonally with respect to the transistor in the island 16, i.e. with the cross-section taken centrally of the channel region thereof and transverse to the direction of current flow so that neither the source nor the drain region appears in the cross-section of FIG. 1. Shown in longitudinal section is a gate structure 46 consisting of a gate insulating layer 48 and a gate conductor 50.

The structure of the device 10 also includes a deposited insulating layer 52 about 600 nm thick which overlies the entire surface of the device and insulates and protects that surface and the gate conductors 44 and 50. Wherever contact to the various active regions of the device is necessary, apertures 54 are located in the insulating coating 52. Conductive metal interconnectors, shown here at 56 and 58, are disposed on the insulating coating 52 and have portions which extend into the apertures 54 to contact and interconnect the active regions of the device.

Of importance to the present invention is the material which is selected for the layer of semi-insulating polysilicon in the layer 28. The electrical characteristics of this material should be such that it is generally semi-insulating but has some finite conductivity. Its conductivity should be high enough so that charge cannot accumulate in the material adjacent to the side edges 22 and 24 of the islands 16 and 18, but its conductivity should be low enough so that any leakage currents which might flow through the layer 28 between the island 16 and the island 18 remain below an amount which would render the circuit of the device non-operative. A layer 28 having a sheet resistivity between about $1 \times 10^8$ ohms/$\square$ and about $1 \times 10^{12}$ ohms/$\square$ meets these criteria.

Although any material which meets the above criteria may be used for the layer 28 in the device 10, the material is preferably either amorphous silicon or polycrystalline silicon. It may also be a modified polysilicon material which is known in the art as "SIPOS" (Semi-Insulating Polycrystalline Oxygen-doped Silicon). In microstructure, amorphous and polycrystalline silicon are similar except that the crystallite size in amorphous silicon is so small that the crystallites are microscopically substantially undetectable. Polycrystalline silicon has somewhat larger and identifiable crystallites. The microstructure of "SIPOS" is generally thought to be unoxidized silicon microcrystals having disordered silicon boundaries therebetween with discrete zones of silicon dioxide at some of these boundaries. See Hamasaki et al, "Crystallographic Study of Semi-insulating Polycrystalline Silicon (SIPOS) Doped with Oxygen Atoms", *Journal of Applied Physics* 49(7), July 1978, pp. 3987–3992.

When the material chosen for the layer 28 is either amorphous or polycrystalline silicon, it is usually formed by chemical vapor deposition from a source of silicon such as silane, $SiH_4$, or silicon tetrachloride, $SiCl_4$, at a relatively low temperature, say 300°–750° C. What is desired here is that the process conditions be selected such that the material is either amorphous or small grained and particularly that it is not doped with conductivity modifiers so as to maintain its conductivity at the desired relatively low level. In the case of amorphous silicon, this material may be deposited from silane in a glow discharge at a temperature of about 300° C. Polysilicon may be similarly deposited but without the glow discharge and at somewhat higher temperatures, e.g. 600° C. If it is desired to use SIPOS for the material of the layer 28, this material can be fabricated by chemical vapor deposition techniques at a temperature of about 650° C. in an atmosphere of silane, $SiH_4$, together with nitrous oxide, $N_2O$, as a source of oxygen, in a nitrogen carrier.

In the preferred embodiment, the silicon dioxide layer 30 on the semi-insulating layer 28 and the gate insulators 42 and 48 on the islands 16 and 18, respectively, are each part of a continuous, integral silicon dioxide layer. The upper surfaces of the layers 30, 42, and 48 may be substantially coplanar although they are shown as slightly offset in the drawing for illustration of the fact that it is seldom possible to achieve mathematical coplanarity in practice. Mathematical coplanarity will be achieved in some devices but only by chance.

FIGS. 2, 3, and 4 illustrate the novel steps of the present method. Steps which are common with prior art processes and routine steps of cleaning, masking, and etching are omitted for purposes of clarity.

FIG. 2 illustrates the configuration of the device 10 at an intermediate stage of the present process. The islands 16 and 18 have been formed on the surface 14 of the substrate 12 by etching in conventional fashion, employing a masking layer 60 of silicon dioxide. The silicon layer from which the islands 16 and 18 are formed is etched completely through to the surface 14 of the substrate 12 in this process, similar to the early SOS air-isolated process. After completion of the silicon etching step, and without removing the masking layer 60, the device 10 is placed in a chemical vapor deposition chamber, and the layer 28 of semi-insulating material is deposited to the desired thickness. The conditions of the deposition atmosphere, including the temperature, are chosen from those described above to impart the desired microstructure. As suggested in FIG. 2, the deposition of the layer 28 is an unmasked, uniform deposition across all of the upper surface of the device 10 such that bodies 62 of this material are formed on the masking layers 60 as well as on the exposed portions of the surface 14 of the substrate 12.

The portions 62 of the layer 28 are undesired in the final structure of the device 10. Removal of these portions 62 may be accomplished by immersing the entire device 10 in a solvent for silicon dioxide, such as a hydrofluoric acid solution. The acid will attack the masking oxide 60 from the edges thereof, and when the oxide has been completely dissolved, the portions 62 will have been separated from the device 10. At this stage in the process, the clean upper surfaces of the islands 16 and 18 and the upper surface 31 of the layer 28 will have been exposed.

After the usual cleaning, the device 10 is next placed in a thermal oxidation furnace for such time and at such temperature as to provide the thermally grown silicon oxide layer 30 on the semi-insulating layer 28 and the gate insulators 42 and 48 on the islands 16 and 18. Under the conditions of the process, and as shown, this thermal oxide 30, 42, 48 will be a continuous integral layer and will be substantially coplanar. At this point, the novel aspects of the present process are complete, and conventional processing may resume.

FIG. 4 illustrates the next steps utilized in fabricating a device 10. There is first provided a deposited polycrystalline silicon layer which is masked and etched to provide the gate conductors 44 and 50, respectively. Using a suitable mask, not shown, and employing the gate conductors as a part of the masking structure, openings here shown at 64 are provided in the gate insulator 42 to expose those portions of the island 16 which are to become the source and drain regions of the transistor. Many similar openings, not shown, will be provided in the device 10. Then, the regions 34 and 36 and other similar regions are formed by conventional diffusion or ion implantation processes, using the gate conductors as a mask in order to obtain a self-aligned relationship between the gate conductors and the various source and drain regions.

The rest of the wafer fabrication steps are illustrated by the configuration shown in FIG. 1. After all diffusion or ion implantation steps have been completed, the device 10 is returned to a chemical vapor deposition reactor, and the insulating coating 52 is deposited as by the reaction of silane and oxygen at about 350° C. to about 450° C. The device 10 is then masked and etched to form contact openings such as the openings 54 after which the upper surface of the device 10 is metallized, as by the deposition of aluminum, and the deposited metal is masked and etched to provide the necessary conductors. Further passivation and packaging steps may next be undertaken in conventional fashion.

The device 10 constructed in accordance with the principles described in this application has been found to be free of edge instability effects. This advantageous result is believed to be attributable to the electrical qualities of the semi-insulating layer 28. Because of its finite conductivity, this material cannot hold charge which charge, if present, could induce undesirable conduction paths, via the field effect, in the edge-adjacent zones of the islands 16 and 18. Because of its finite conductivity, the layer 28 might be regarded as a source of difficulty in providing leakage current paths between adjacent islands, but it has been found that although some leakage may take place, its magnitude is comparable with or lower than leakage currents found in conventionally fabricated devices. Further, the dielectric strength of the combination of the semi-insulating layer 28 and the thermally oxidized layer 30 has been found to be as good as the dielectric strength of the oxide formed in the known LOSOS process. Thus, devices fabricated in accordance with the present disclosure can be expected to have improved yields in manufacturing for some types of circuits and to exhibit superior stability under long time/high temperature/high electric field conditions.

What is claimed is:

1. An improved semiconductor-on-insulator device including an insulating substrate having a surface, spaced islands of epitaxial silicon on the surface of the substrate, each of said islands having a surface substantially parallel to the surface of the substrate and each having side surfaces at an angle to the surface of the substrate, and passivating means on the surface of the substrate in the spaces between the islands, wherein the improvement comprises said passivating means comprising a layer of oxygen doped polycrystalline silicon semi-insulating material on and contiguous with the surface of the substrate and extending between the islands in contiguous relation to the sidewalls thereof.

2. A semiconductor-on-insulator device as defined in claim 1 wherein said passivating means further comprises a layer of silicon dioxide on the layer of semi-insulating material.

3. A semiconductor-on-insulator device as defined in claim 2 wherein said layer of oxygen doped polycrystalline silicon semi-insulating material is composed of amorphous or polycrystalline silicon.

4. A semiconductor-on-insulator device as defined in claim 2 wherein the layer of oxygen doped polycrystalline silicon semi-insulating material is a layer which contains silicon microcrystals with disordered silicon boundaries therebetween, and wherein discrete zones of silicon oxide are disposed at some of said boundaries.

5. A semiconductor-on-insulator device as defined in claim 2 wherein each of the islands has a layer of silicon dioxide on the parallel surface thereof, said layer having the characteristics of an MOS gate insulator.

6. A semiconductor-on-insulator device as defined in claim 5 wherein the layer of silicon dioxide on the layer of oxygen doped polycrystalline semi-insulating material and the layers of silicon dioxide on the islands are each part of a continuous, integral silicon dioxide layer.

* * * * *

UNITED STATES PATENT AND TRADEMARK OFFICE
CERTIFICATE OF CORRECTION

PATENT NO. : 4,262,299

DATED : April 14, 1981

INVENTOR(S) : William Edward Ham

It is certified that error appears in the above-identified patent and that said Letters Patent is hereby corrected as shown below:

Claim 6, line 3, after "polycrystalline" insert --silicon--.

Signed and Sealed this

Twenty-eighth Day of July 1981

[SEAL]

Attest:

*Attesting Officer*

GERALD J. MOSSINGHOFF

*Commissioner of Patents and Trademarks*